United States Patent [19]

Nakauchi et al.

[11] Patent Number: 5,455,840
[45] Date of Patent: Oct. 3, 1995

[54] METHOD OF COMPENSATING A PHASE OF A SYSTEM CLOCK IN AN INFORMATION PROCESSING SYSTEM, APPARATUS EMPLOYING THE SAME AND SYSTEM CLOCK GENERATOR

[75] Inventors: Toshihiko Nakauchi; Masato Hirai, both of Hadano, Japan

[73] Assignee: Hitachi, Ltd., Tokyo, Japan

[21] Appl. No.: 123,358

[22] Filed: Sep. 17, 1993

[30] Foreign Application Priority Data

Sep. 18, 1992 [JP] Japan .................................. 4-250173

[51] Int. Cl.⁶ ................................ H04L 7/00; H03K 5/13
[52] U.S. Cl. .......................... 375/371; 327/147; 327/156; 327/233; 327/234; 326/94
[58] Field of Search ........................... 328/155; 375/118; 327/147, 146, 156, 233, 234, 235; 326/94, 96; 331/14, 34

[56] References Cited

U.S. PATENT DOCUMENTS 5,194,828  3/1993  Kato ............................................. 331/1
5,297,869  3/1994  Benham ..................................... 328/155

Primary Examiner—Walter E. Snow
Assistant Examiner—John Ning
Attorney, Agent, or Firm—Antonelli, Terry, Stout & Kraus

[57] ABSTRACT

A method of compensating a phase of a system clock for use in a system clock circuit for receiving an external clock to produce a system clock for an information processing system, in which the quantity of phase variation of the external clock supplied from a reference clock oscillator provided outside the system is detected; in accordance with the detected quantity of phase variation, the phase variation of the external clock supplied from the reference clock generator is compensated to supply the compensated external clock to the system clock circuit; whether or not a state of the external clock supplied from the reference clock oscillator provided outside the system is abnormal is detected; and in accordance with the detected state of the external clock, one of the external clock supplied from the reference clock oscillator and the compensated external clock is selected to supply the selected external clock to the system clock.

31 Claims, 11 Drawing Sheets

METHOD OF COMPENSATING A PHASE OF A SYSTEM CLOCK IN AN INFORMATION PROCESSING SYSTEM, APPARATUS EMPLOYING THE SAME AND SYSTEM CLOCK GENERATOR

CROSS REFERENCE OF RELATED APPLICATION

This application relates to the subject matter of a copending U.S. application Ser. No. 08/005,034 filed on Jan. 15, 1993.

BACKGROUND OF THE INVENTION

Field of the Invention

The present invention relates to a method of compensating a phase of a system clock synchronous with an external clock in an information processing system and an apparatus employing the same, and more particularly to a method of compensating a phase of a system clock when a phase of an external clock is varied, an apparatus employing the same and a system clock generator.

In order to synchronize an information system, e.g., a local area network (hereinafter, referred to as "LAN" for short, when applicable) with a digital network of a common carrier, in general, it is one effective measure that a clock of the digital network clock of the common carrier input from the outside world to the LAN (hereinafter, referred to as "an external clock" for short, when applicable) is divided with its frequency into 8 kHz as the greatest common divisor between 1.544 Mbps of a high speed digital interface and 2.028 Mbps of a PBX private interface, thereby to synchronize with a system clock source of the LAN through a phase-locked loop (hereinafter, referred to as "PLL" for short, when applicable) and is transmitted as a clock in which a high frequency jitter (a swinging of a clock edge) of the external clock is removed to the associated nodes.

FIG. 1 is a block diagram showing an example of a configuration of the above-mentioned well known PLL which includes a phase comparator 21, a low-pass filter (hereinafter, referred as LPF" for short, when applicable), a voltage controlled oscillator (hereinafter, referred to as "VCO" for short, when applicable), and a dividing circuit 24.

The PLL shown in FIG. 1 operates in such a way that the phase comparator 21 compares the phase of a clock (external clock) 26 from a circuitry network provided outside the system (external network) and that of an output clock of the dividing circuit 24 (hereinafter, referred to as "a PLL output clock", when applicable) with each other, LPF 22 converts a phase comparison output 27 of the phase comparator 21 into a smoothed voltage signal 28, and VCO 23 is controlled by an output of LPF so as to oscillate a signal with a predetermined frequency.

VCO 23 is an oscillator of the voltage controlled type wherein its oscillation frequency is varied in accordance with the voltage of the output 28 of LPF. The frequency of an output 29 of VCO is divided into 1/N (N: integral number equal to or larger than 2) by the dividing circuit 24. Then, when the external clock is in a normal state, the resultant clock 25 is utilized as the system clock source of the LAN.

In a PLL having such a configuration, if the frequency of the output of VCO 23 is varied due to some unavoidable causes, the frequency of the output clock 25 of PLL will also be varied. On the basis of the frequency variation, the phase comparator 21 outputs its output signal 27 to LPF 22 so as to decrease the phase difference. As a result, the difference in phase between the clock 26 of the external network and the PLL output clock 25 is gradually decreased so that both the clocks can synchronize with each other. Incidentally, normally, the frequency of the output 29 of VCO is set to N times as large as that of the synchronous clock of the external network and thus the clock thereof is supplied as the system clock of the system (apparatus) accommodated in each node in the LAN.

In addition, if the phase variation (step) occurs in the external clock 26 (an input clock of the PLL), the output 27 of the phase comparator 21 corresponding to that phase variation is converted into the voltage signal 28 by LPF 22 so that the frequency of the output 29 of VCO is varied. This frequency variation of the output 29 of VCO is increased or decreased so as to decrease the difference in phase between the external clock 26 and the output clock 25 of the PLL, i.e., to decrease the output 27 of the phase comparator 21, and when it has been finally completed that the phase of the PLL output clock 25 follows the phase of the external clock 26, the frequency of the output 29 of VCO becomes a fixed frequency. More specifically, if the phase variation occurs in the external clock, the frequency of the output 29 of the VCO is varied, whereby the temporal frequency variation is caused in the PLL output clock 25.

By the temporal frequency variation of PLL, there arises a problem that a fault such as mistaken sampling of the data may occur in the system (apparatus) accommodated in each node in LAN in some cases, and as a result, temporary communication cannot be performed. Since this fault is a fault relating to the system clock, the influence of the fault becomes large as the scale of the LAN is larger. In addition, in the system requiring the real time processing, the communication impossible period of time due to that fault reduces the performance of the system.

As the means of solving the above-mentioned problem, there is known a method wherein an elastic buffer is used and the data is temporarily stored in the elastic buffer, whereby the temporal frequency variation of PLL is absorbed. An example of utilizing this method is shown in FIG. 2. In FIG. 2, the reference numeral 30 designates an elastic buffer; the reference numeral 31 designates the PLL; the reference numeral 32 designates an external system (apparatus); the reference numeral 33 designates an internal system (apparatus); the reference numeral 34 designates write data; the reference numeral 35, a write clock; the reference numeral 36, read data; and the reference numeral 37, a read clock.

The write data 34 which has been received from the external system (apparatus) is input to the elastic buffer 30 using the write clock 35. On the other hand, the data which has been fetched from the elastic buffer 30 using the read clock 37 by the internal system (apparatus) is the read data 36. As long as the clock of the external system (apparatus) synchronizes with the clock of the internal system (apparatus), the average speed of the reading operation is the same as that of the writing operation. Even if a temporal frequency variation of the PLL 31 occurs, the capacity of the data in the elastic buffer 30 is increased or decreased, whereby the temporal frequency variation is absorbed and thus the internal system (apparatus) can receive the data without hindrance. In addition, in the case where the temporal frequency variation is large, the capacity of the elastic buffer 30 itself is increased, whereby it is possible to prevent the internal system from being influenced by the faults of the overflow and the underflow (deficiency of data) of the elastic buffer. The configuration of the circuit of FIG. 2 is shown in JP-A-1-264426 for example.

SUMMARY OF THE INVENTION

In the arrangements, as described above, it is possible to prevent the internal system (apparatus) from falling i.e., experiencing a temporal fault due to the temporal frequency variation of PLL following the phase variation of the external clock. However, the performance of the internal system (apparatus) requiring real time processing is remarkably hindered. That is, by the provision of the elastic buffer, the response of the internal system (apparatus) becomes delayed due to the data delay in the elastic buffer. Therefore, in the system requiring the real time processing, the capacity of the elastic buffer is limited by the required response time, or such an elastic buffer may not be provided in some cases.

It is therefore an object of the present invention to provide a method of compensating a phase of a system clock in an information processing system, an apparatus employing the same and a system clock generator which are capable of removing the above-mentioned problems of the related art.

It is another object of the present invention to provide a method of compensating a phase of a system clock in an information processing system, an apparatus employing the same and a system clock generator which are capable of preventing, even when a phase of an external clock is varied, the frequency variation of the system clock following the phase variation without occurrence of delay of a response of the information processing system.

According to an aspect of the present invention, there is provided an apparatus for compensating a phase of a system clock for use in a system clock circuit for receiving an external clock to produce a system clock for an information processing system, which apparatus includes: a phase variation quantity detecting unit for detecting the amount of phase variation of an external clock supplied from a reference clock oscillator provided outside a system; and a compensation unit for compensating, in accordance with the amount of phase variation detected by the detection unit, the phase variation of the external clock supplied from the reference clock oscillator to supply the compensated external clock to the system clock circuit.

According to an example of the present invention, the compensation unit includes: a unit for generating two clocks, which are asynchronous with the external clock and are 180 degrees out of phase with each other, on the basis of the external clock supplied from the reference clock oscillator; a first selection unit for selecting one of the two clocks supplied from the clock generating unit in accordance with the amount of phase variation detected by the phase variation quantity detecting unit; a delay unit for delaying the clock selected by the first selection unit by a predetermined period of time to output the delayed clock; and a second selection unit for selecting one of the clock selected by the first selection unit and the output clock supplied from the delay unit in accordance with the amount of phase variation detected by the phase variation quantity detecting unit to supply the selected clock to the system clock circuit.

According to another aspect of the present invention, there is provided an apparatus for compensating a phase of a system clock for use in a system clock circuit for receiving an external clock to produce a system clock for an information processing system, which apparatus includes: a detection unit for detecting whether or not a state of the external clock supplied from a reference clock oscillator provided outside a system is abnormal to output a detection signal representing the detected state; a compensation unit for compensating a phase of the external clock supplied from the reference clock oscillator to output the compensated external clock; and a selection unit for selecting one of the external clock supplied from the reference clock oscillator and the compensated external clock supplied from the compensation unit in response to the detection signal supplied from the detection unit to supply the selected clock to the system clock unit.

Since the present invention is designed in the above-mentioned manner, in the information processing system having the system clock circuit for receiving the external clock to produce the system clock, the phase compensating circuit operates to compensate, at the time when the phase variation occurs in the external clock, the phase of the input external clock to output the external clock after the compensation to the system clock circuit. Thus, by the provision of the phase compensating circuit between the the external clock and the system clock circuit, it is possible to absorb the phase variation as a primary factor for causing the frequency variation in the system clock circuit. As a result, since there is no need for storing the data in the buffer as in the above-mentioned prior art, the delay of the data, i.e., the delay of a response of the system, can be effectively prevented.

According to an example of the present invention, the unit for detecting the abnormality of the external clock is provided, and in accordance with the detection result provided by the detection unit, one of the external clock and the compensated external clock supplied from the phase compensating unit is selectively supplied to the system clock circuit. Therefore, there can be automatically supplied to the system clock circuit the external clock in the free running oscillation state and the synchronization process of the system clock circuit and the output of the phase compensating unit in the synchronization state.

According to an example of the present invention, since the phase of the external clock is compensated in accordance with the amount of phase variation, it is possible to prevent frequency variation due to phase variation of the external clock in the system clock circuit.

According to an example of the present invention, the timing at which the units switch their inputs is performed at suitable points other than the change point of the inputs. Therefore, a so-called metastable phenomenon can be effectively prevented, and the clock supplied to the system clock circuit can be always stabilized.

DESCRIPTION OF THE PREFERRED EMBODIMENTS

Figure 1:
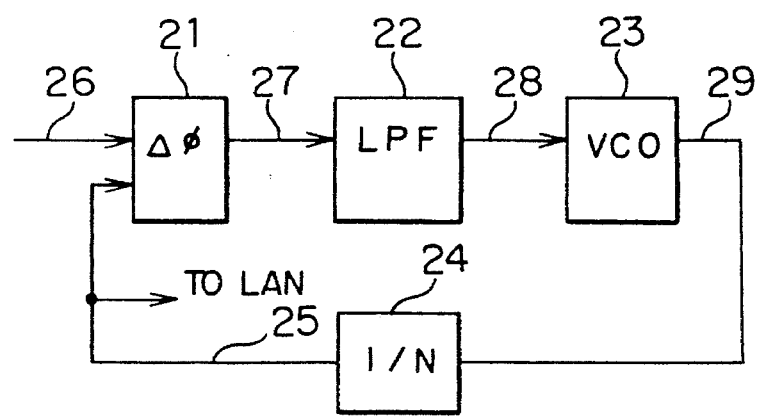
FIG. 1 is a block diagram showing a configuration of PLL.
Figure 2:
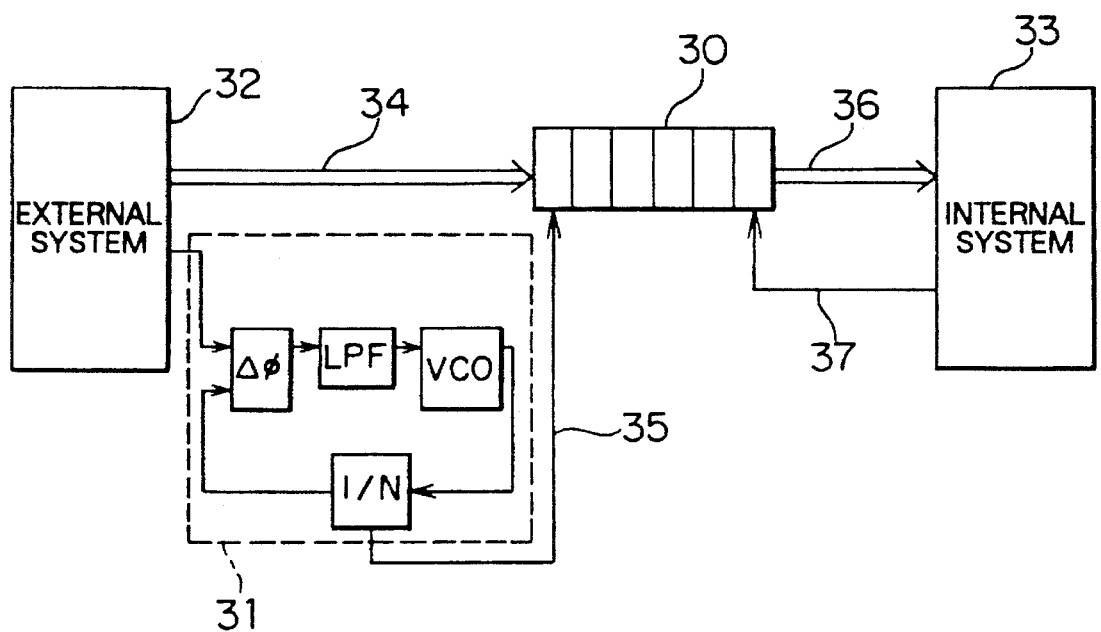
FIG. 2 is a block diagram showing a configuration of an example of the disadvantageous system clock generating circuit.

The preferred embodiments of a method of compensating a phase of a system clock and a circuit employing the same according to the present invention will hereinafter be described in detail with reference to the accompanying drawings. In the figures, those parts corresponding to similar parts in FIGS. 1 and 2 are designated with the same reference numerals, and the description thereof will be omitted for the sake of simplicity.

Figure 3:
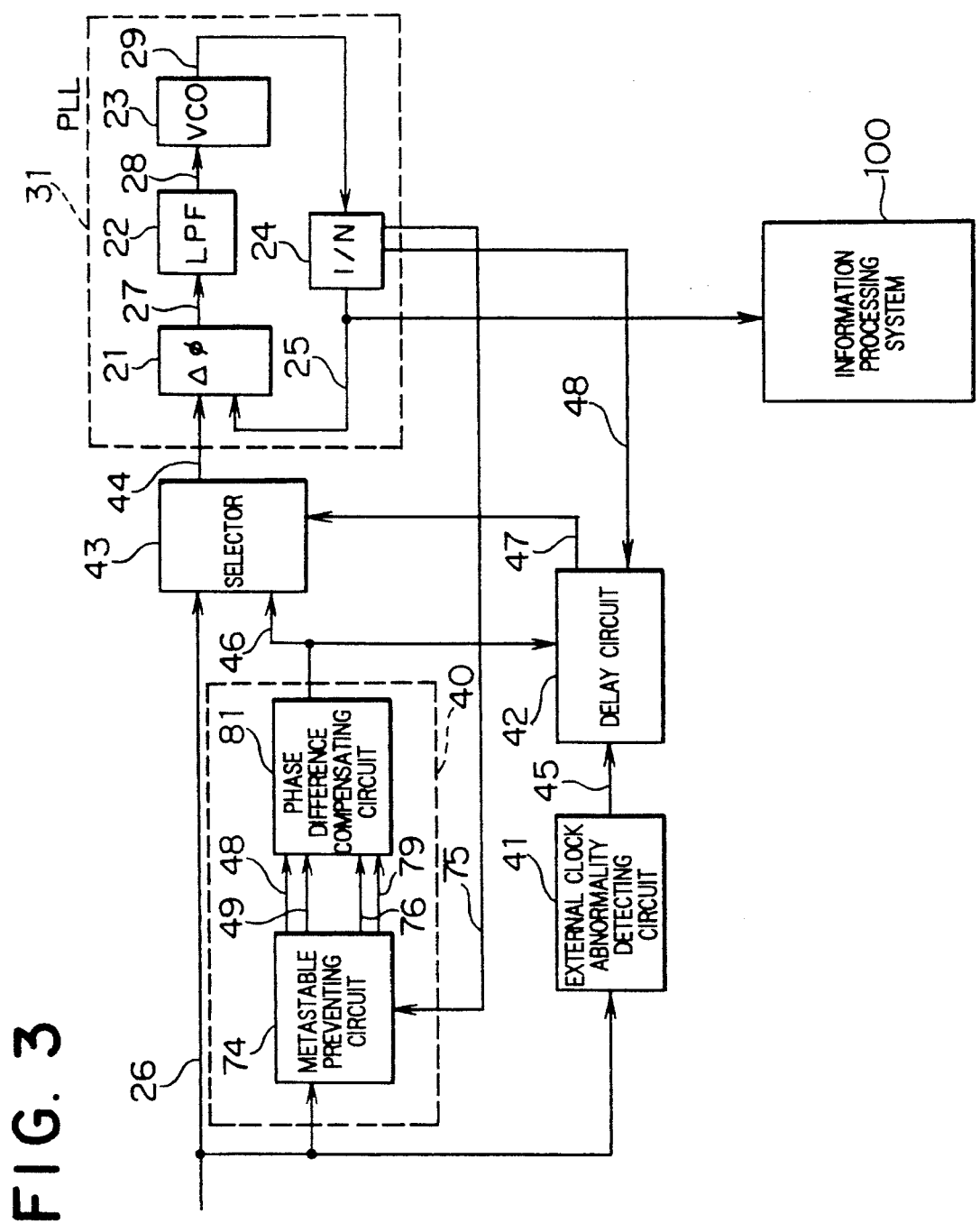
FIG. 3 is a block diagram showing a configuration of a system clock generating circuit having a circuit for compensating a phase of a system clock according to a first embodiment of the present invention.

FIG. 3 is a block diagram showing a configuration of a system clock generating circuit having a circuit for compensating a phase of a system clock according to a first embodiment of the present invention.

The system clock generating circuit includes a frequency synthesizer or a system clock circuit, e.g., PLL 31, a circuit 40 for compensating a phase of a system clock, a circuit 41 for detecting an abnormality of an external clock, a delay circuit 42 and a selector 43, and the output clock of the PLL 31 is supplied as a system clock to an information processing system 100.

The system clock phase compensating circuit 40 operates to compensate the phase variation of an external clock 26 in such a way that the phase variation does not occur in an input clock 44 of the PLL 31, when the phase variation occurs in the external clock 26 supplied from a reference clock generator (not shown) provided outside the system.

The system clock phase compensating circuit 40 includes a metastable preventing circuit 74 which operates to prevent a metastable occurrence (i.e., the phenomenon in which when the setup time and the hold time can not be ensured, the voltage level of the output of a flip-flop becomes temporarily unstable) of an input clock 49 and a circuit 81 for compensating a phase difference. The phase compensating circuit 40 operates using dividing clocks 48 and 75 of PLL as the actuating clock. The external clock abnormality detecting circuit 41 operates to detect the interruption or frequency abnormality of the external clock 26 to output a signal to the delay circuit 42. Even if the external clock abnormality detecting circuit 41 detects that the external clock becomes normal by the input start of the external clock or the abnormality recovery thereof, PLL 31 is still in the synchronization process from the free running oscillation state. Therefore, the delay circuit 42 operates to switch the output of the selector 43 from the external clock 26 to the output clock 46 of the phase compensating circuit 40 after the delay of a predetermined period of time so that after the input start of the external clock or the abnormality recovery thereof, the time when the PLL can synchronize with the external clock can be secured. The selector 43 for selecting an input to the PLL operates to use the external clock 26 as a the PLL input clock 44 in the the PLL free running oscillation state in the no-input state of the external clock or in the abnormal state thereof, and in the PLL synchronization process in the abnormality recovery of the external clock, while to use the output clock 46 of the phase compensating circuit as the PLL input clock 44.

The present embodiment is based on the assumption that the control for the phase compensation is performed with the clock synchronizing with the external clock as the input clock to PLL. If the control for the phase compensation is performed using PLL dividing clocks 48 and 75 in the PLL free running state and the synchronization process in which the PLL 31 does not synchronize with the external clock, a flip-flop which is provided inside the phase compensating circuit 40 will sample the asynchronous clock. Therefore, the change point of the output clock 46 of the phase compensating circuit causes the discrete phase variation to occur in the PLL free running state and the synchronization process. Then, if the output clock 46 of the phase compensating circuit is used as the PLL input clock 44 in the PLL synchronization process, since the PLL operates using the clock which has been disturbed by the discrete phase variation, the PLL performs the unstable (nonpredictable) operation after all. Since this operation can not be predicted, the PLL synchronization time may become long in some cases, and therefore, this will influence the performance of the system. As a result, for the purpose of avoiding the above-mentioned inconvenience, the circuit of FIG. 3 includes the external clock abnormality detecting circuit 41, the delay circuit 42 and the selector 43 for selecting a the PLL input.

From the foregoing, by the configuration of the circuit shown in FIG. 3, the external clock 26 is used as the PLL input clock 44 in the free running state, and the synchronization process of the PLL 31, while the output clock 46 of the phase compensating circuit is used as the PLL input clock 44. Therefore, there is prevented the phenomenon that PLL causes the unstable retracting operation by using the unstable PLL dividing clock 48 in the PLL synchronization process as the actuating clock of the phase compensating circuit 40, and also the control for the phase compensation in the synchronization state can be surely performed.

Incidentally, the timing when the abnormality occurs in the external clock to make PLL 31 in the free running oscillation state is the time when detecting the abnormality of the external clock. In addition, when the external clock has been recovered, this recovery is detected. Then, after the lapse of a predetermined period of time obtained on the basis of the design (e.g., the lapse of the period of time corresponding to the pulse width of the clock 65), the PLL input clock is returned to the clock 46.

Figure 4:
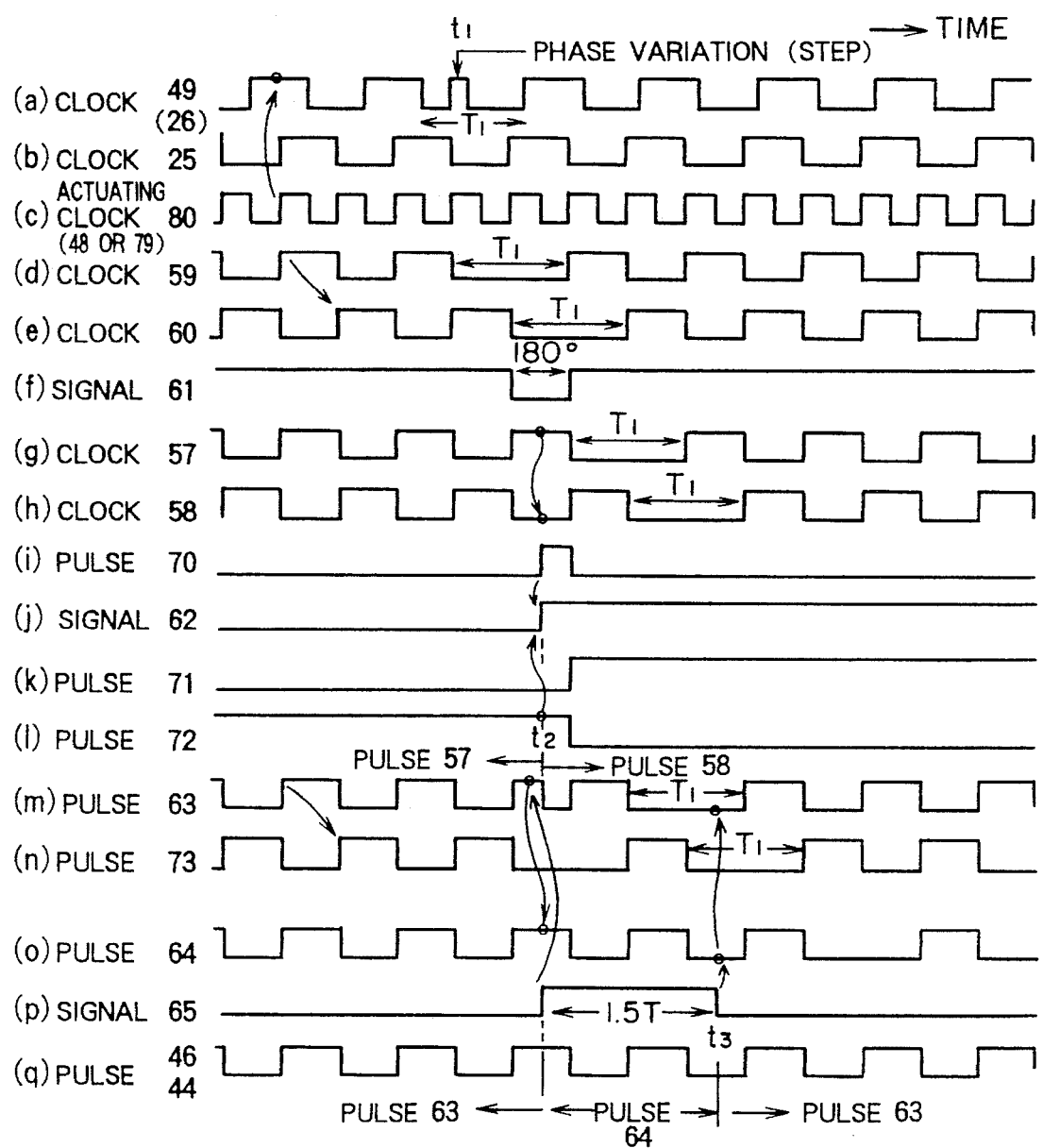
FIG. 4 is a timing chart showing signal waveforms of units useful in explaining the operation of a 180 degrees-phase step mode of the circuit for compensating a phase of a system clock of FIG. 3.
Figure 5:
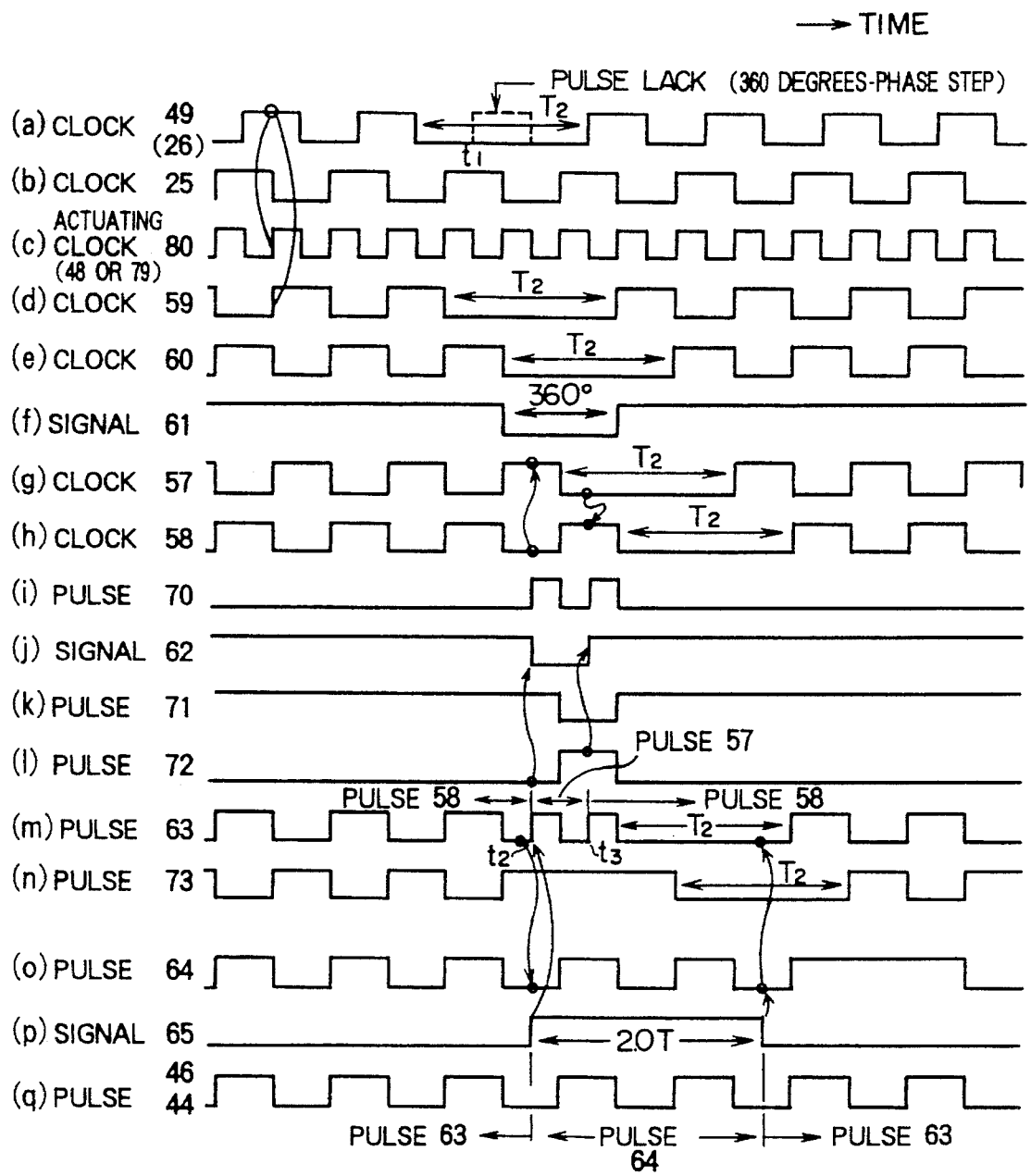
FIG. 5 is a timing chart showing signal waveforms of units useful in explaining the operation of a 360 degrees-phase step mode of the circuit for compensating a phase of a system clock of FIG. 3.

Referring now to FIGS. 4 and 5, FIG. 4 is a timing chart showing the operation in the 180 degrees-phase step (phase inversion) mode of the phase compensation controlling circuit 40 in FIG. 3. FIG. 5 is a timing chart showing the operation in the 360 degrees-phase step (clock lack/omission) mode. In those figures, the reference symbol T represents one cycle of the clock 26 or 49. In addition, T1 is in the range of $0.5\ T < T1 \leq 1.0\ T$, and T2 is 1.5 T.

The description will hereinbelow be given with respect to the operation of the circuit 40 for compensating a phase of a system clock with reference to those timing charts.

Figure 6:
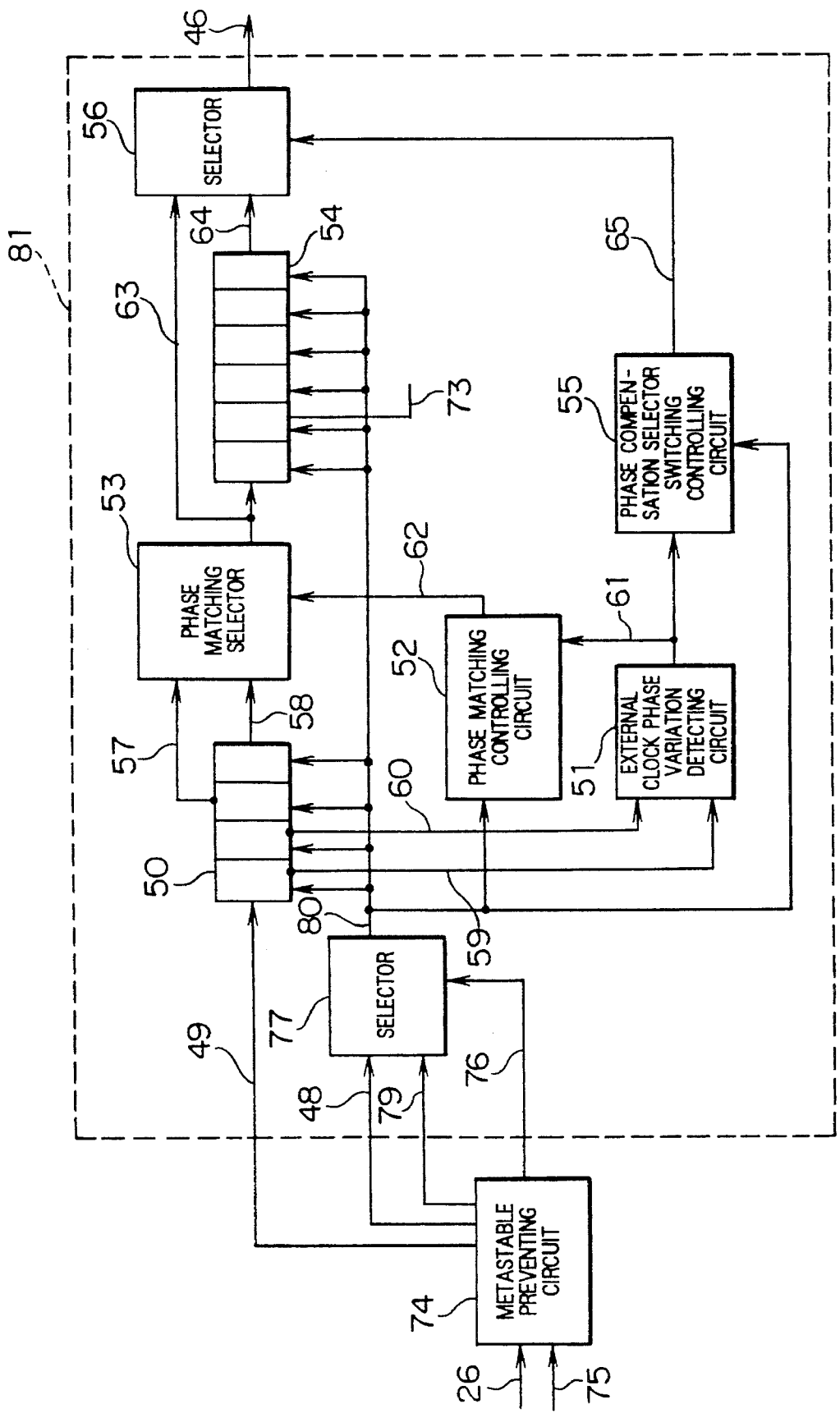
FIG. 6 is a block diagram showing an example of a configuration of a circuit for compensating a phase difference in FIG. 3.

FIG. 6 is a block diagram showing an example of a configuration of the phase difference compensating circuit 81 shown in FIG. 3. The frequency of an actuating (operation) clock 80 of this circuit is equal to that of the clock 48. Further, the frequency of the clock 48 is, for example, set to two times as higher as that of the output clock 25 of the PLL by the dividing circuit 24. Therefore, the cycle of the actuating clock 80 is one half of that of the external clock 26. The operation of the phase compensation in this circuit 81 is performed on the basis of the following idea. In a shift register 50, the external clock 26 is sampled using the actuating clock 80 the frequency of which is two times as higher as that of the external clock 26, thereby to produce two clocks 57 and 58 each frequency of which is one half of the frequency of the actuating clock (the same frequency as that of the system clock) and which are 180 degrees out of phase with each other and have the phase variation. Since in the present embodiment, the phase of the system clock is matched with that of the actuating clock 80 irrespective of the phase variation of the external clock, if there is no phase variation, one of the clocks 57 and 58 may be output. Therefore, when there is no phase variation, one of the clocks 57 and 58 is output as a clock 63 through the selector 53. On the other hand, when there is the phase variation, i.e., the phase of the clock 26 is being varied, the circuit 81 operates to output a clock 64 from the selector 53 which has been stored before the occurrence of the phase variation in a register 54 composed of a buffer or delay circuit, e.g., a D-type flip-flop, and at the time point when the phase variation has been completed, to output one of the clocks 57 and 58 as the clock 63 in accordance with the amount of phase variation. The reason for adopting such procedure is that at the time point when the phase variation has been completed, the proper system clock should be equal to one of the clocks 57 and 58 in accordance with the amount of phase variation (because the cycle of the actuating clock 80 is one half of that of the external clock 26).

A shift register 50 is, for example, a four stage-shift register and operates to store a signal on the basis of which the phase variation of the external clock is detected and the phase matching is controlled. A clock 59 ((d) in FIG. 4) in the first stage and a clock 60 ((e) in FIG. 4) in the second stage in the shift register 50 are supplied to a circuit 51 for detecting phase variation of the external clock, and a clock 57 ((g) in FIG. 4)in the third stage and a clock 58 ((h) in FIG. 4) in the fourth stage of the shift register 50 are supplied to a phase matching selector 53. The external clock phase variation detecting circuit 51 is composed of an OR circuit for example and operates to compare the clock in the first stage of the shift register 50 with the clock in the second stage thereof and to output, when detecting the phase variation of the clock 49, a signal representing the amount of phase variation as a phase variation detecting signal 61 to both a circuit 52 for controlling phase matching and a circuit 55 for switching and controlling a phase compensating selector. That is, the pulse width of the phase variation detecting signal 61 is 180 degrees ((f) in FIG. 4) when the amount of phase variation of the clock 49 is less than 180 degrees ((a) in FIG. 4), and is 360 degrees ((f) in FIG. 5) when the amount of phase variation of the clock 49 is equal to or more than 180 degrees but less than 360 degrees ((a) in FIG. 5).

The phase matching controlling circuit 52 operates to output a phase matching selector switching signal 62 in accordance with the amount of phase variation represented by the phase variation detecting signal 61, thereby to perform the switching control of the output clock in the phase matching selector 53. That is, the phase matching controlling circuit 52 operates to perform the phase matching control. The phase matching selector 53 operates to perform the above-mentioned phase matching control on the basis of the phase matching selector switching signal 62 when the phase variation occurs in the external clock, and to supply the clock, as an output clock 63 of the phase matching selector, which is convenient for the subsequent control for the phase compensation, to both the phase compensation controlling shift register 54 and the phase compensating selector 56. The phase compensation controlling shift register 54 is a sixth stage-shift register for example. The system clock signal, i.e., the output clock 63 is stored in the register 54, whereby even if the phase is changed due to the phase variation of the external clock, the clock before the change is output so that the control for the phase compensation can be performed. The phase compensation selector switching controlling circuit 55 operates to supply a phase compensation selector switching signal 65 corresponding to the amount of phase variation represented by the phase variation detecting signal 61 to the phase compensating selector 56, thereby to control the switching time of the selector 56. The phase compensating selector 56 operates to perform the switching between the output clock 63 of the phase matching selector and a clock 64 in the final stage in the phase compensation control shift register 54 on the basis of a phase compensation selector switching signal 65 to output selectively one of them, whereby the output clock 46 of the phase compensating circuit, which has been output by the selector 56 can be made a clock which has been compensated for the phase.

Incidentally, in the present embodiment, the number of stages of the phase compensation controlling register 54 is six. However, in the case where the register 54 is made to be able to correspond to the 540 degrees-phase step mode (the amount of phase variation is equal to or more than 360 degrees but less than 540 degrees) and the 720 degrees-phase step mode (the amount of phase variation is equal to or more than 540 degrees but less than 720 degrees) as well, the number of stages of the register 54 is seven and is eight, respectively.

Further, in (n) of FIGS. 4 and 5, a pulse 73 represents the output waveform of the second stage of the register 54.

With a metastable preventing selector 77, the input clock to the selector 77 is switched from the clock 48 to a clock 79 on the basis of a switching signal 76 from a metastable preventing circuit 74 provided in the preceding stage, whereby the actuating clock 80 output by the selector 77 becomes a clock the phase of which is shifted by ⅛ cycle ($\pi/4$).

Therefore, in the shift register 50, in response to the rise of an actuating clock 80 ((c) in FIG. 4) for example, the clock 49 is sampled. However, normally, the rise of the actuating clock 80 does not coincide with the rise or fall of the clock 49, or come close sufficiently thereto, and thus the sampling of the clock 49 is normally performed and the phase compensation is normally performed. But, if the phase variation occurs in the clock 49, there occurs the phenomenon (metastable) that the rise of the actuating clock 80 coincides with the rise or fall of the clock 49 or comes close sufficiently thereto. Then, the clock 49 can not be normally sampled, and the output clock of the shift register 50 becomes unstable. As a result, the phase compensation cannot be normally performed. Then, in the metastable preventing circuit 74 as will be described later, at the time when it has been detected that the rise of the actuating clock 80 coincides with the rise or fall of the clock 49, the switching signal 76 is output to the selector 77. Then, the selector 77 outputs, instead of the clock 48, the clock 79 the phase of which is shifted from the phase of the clock 48 by $\pi/4$, as an actuating clock 80. Therefore, it is possible to prevent the metastable from occurring in the shift register 50.

Figure 7:
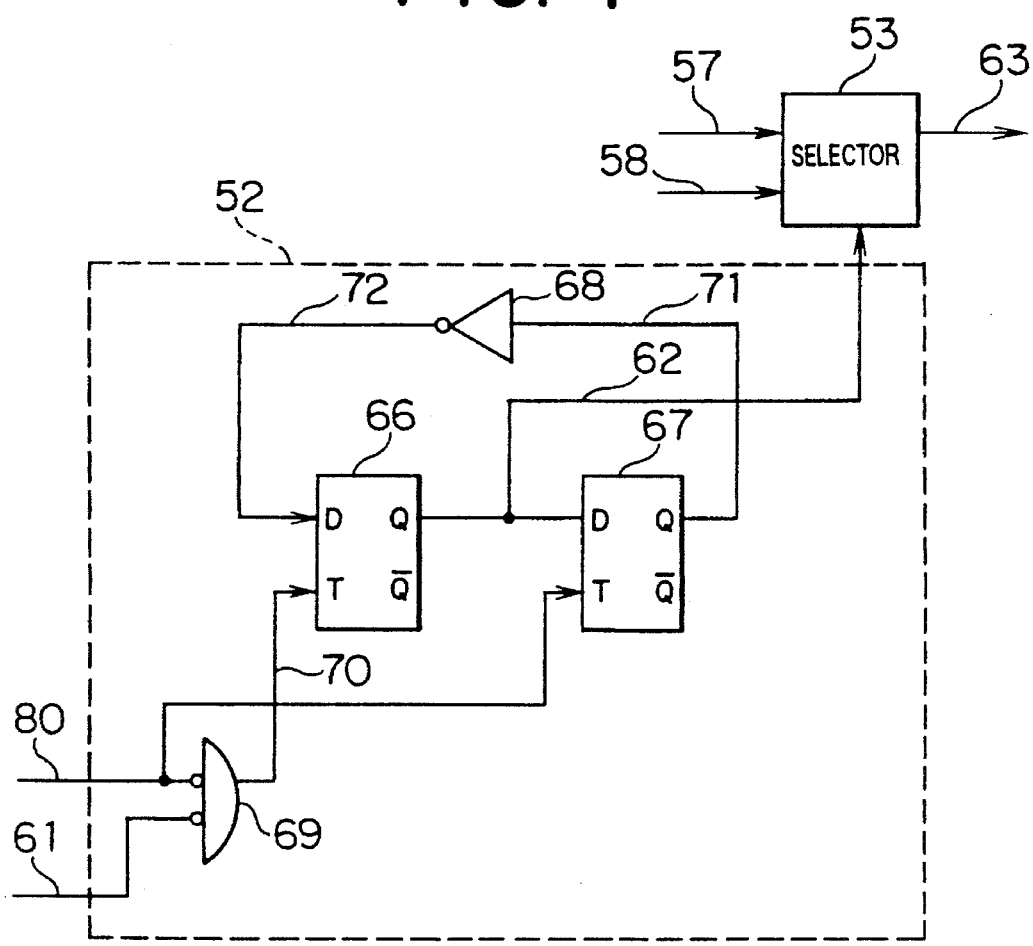
FIG. 7 is a block diagram showing an example of a configuration of a circuit for controlling phase matching in FIG. 6.

FIG. 7 is a circuit diagram showing an example of a configuration of the phase matching controlling circuit 52 shown in FIG. 6. A binary counter is constituted by flip-flops, e.g., D-type flip-flops 66 and 67 and an inverter 68. In terms of a configuration of the circuit of FIG. 6, the clock the cycle of which is one half of the cycle of the external clock 26 is used as the actuating clock 80 (the sampling clock for the clock 49). Therefore, the two kinds of phase variation modes appear in the external clock phase variation detecting circuit 51. That is, the two kinds of modes are the 180 degrees-phase step (phase inversion) mode when the phase of the clock 49 is varied by the quantity less than 180 degrees, and the 360 degrees-phase step (clock lack/omission) mode when the phase of the clock 49 is varied by the quantity equal to or more than 180 degrees but less than 360 degrees. Therefore, in the case of the 180 degrees-phase step mode, on the basis of the actuating clock 80 and the phase variation detecting signal 61, one trigger pulse 70 ((i) in FIG. 4) is produced by an AND circuit 69 and the binary counter is counted up by one, whereby the output signal 62 of the binary counter is made "high" ((j) in FIG. 4) and the phase matching selector 53 is switched by one time. As a result, the pulse 63 is switched from the pulse 57 to the pulse 58 for example so that the phase matching for the phase inversion of the clock 49 can be performed.

On the other hand, in the case of the 360 degrees-phase step mode, two trigger pulses 70 are produced ((i) in FIG. 5), and the binary counter is counted up by two, whereby the signal 62 is switched as follows: "high"→"low"→"high". Thus, the pulse 63 is switched from the pulse 58 to the pulse 57 for example, and further is switched from the pulse 57 to the pulse 58. That is, the operation can be performed such that after the phase matching selector 53 has been switched once, the selector 53 is returned to the original state. In other words, in the case of 360 degrees-phase step mode, the phase matching operation is not performed. Incidentally, the waveforms of the pulses 71 and 72 are shown in (k) and (l) of FIGS. 4 and 5, respectively.

Next, the description will hereinbelow be given with respect to an example of a configuration of the phase compensating selector switching controlling circuit 55 shown in FIG. 6 and the operation thereof with reference to a block diagram of FIG. 8 and a timing chart showing the waveforms of the units of FIG. 9.

The phase compensating selector switching controlling circuit 55 operates to generate the phase compensating selector switching signal 65 ((p) in FIGS. 4 and 5) as the pulse which has the pulse width corresponding to the amount of phase variation represented by the phase variation detecting signal 61 to supply this signal 65 to the phase compensating selector 56.

Figure 8:
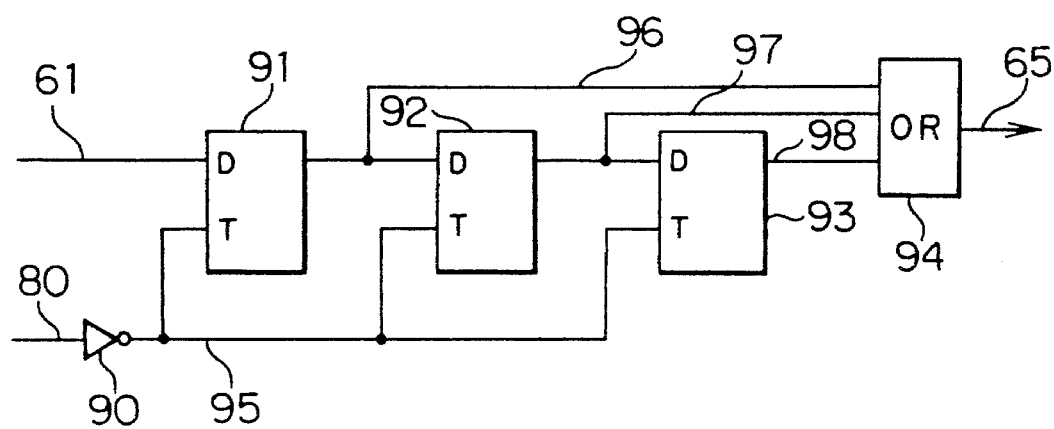
FIG. 8 is a block diagram showing an example of a configuration of a circuit for controlling and switching a phase compensating selector in FIG. 6.
Figure 9:
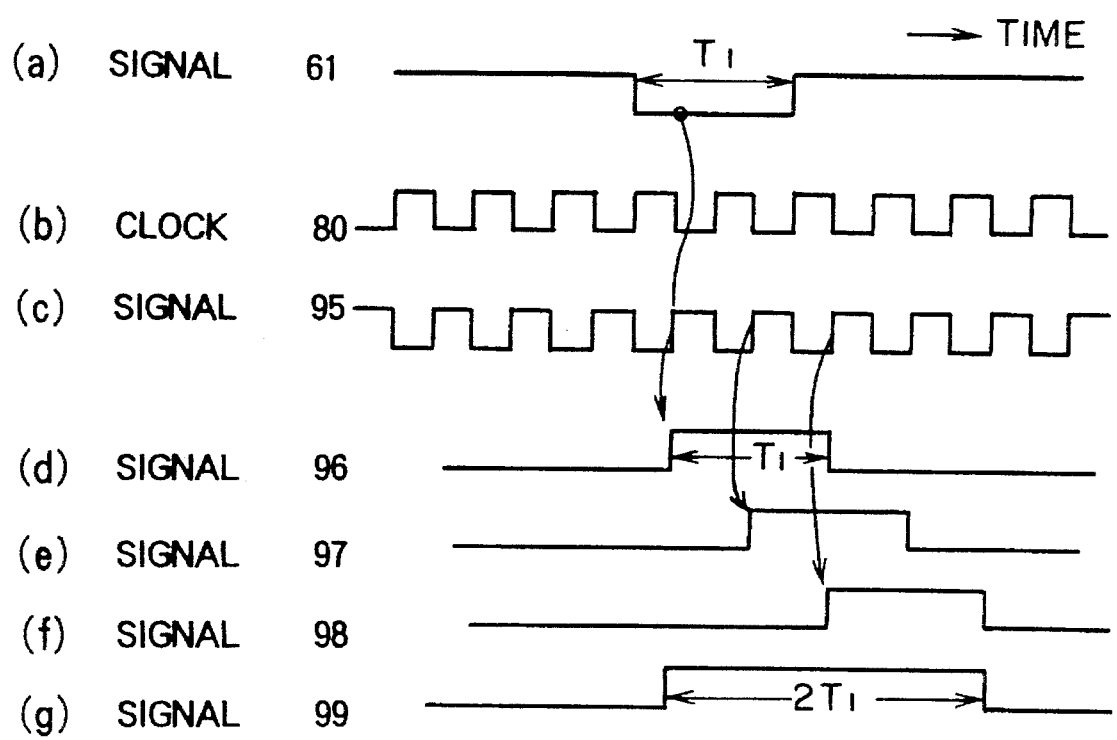
FIG. 9 is a timing chart showing signal waveforms of units useful in explaining the operation of the circuit for controlling and switching a phase compensating selector of FIG. 8.

As shown in FIG. 8, the circuit 55 includes an inverter 90, flip-flops, e.g., D-type flip-flops 91 to 93 and an OR circuit 94. Therefore, in the case of the 360 degrees-phase step mode for example, the waveforms of the units are as shown in FIG. 9. Thus, the pulse 65 which is obtained by OR-tying output pulses 96 to 98 of the flip-flops 91 to 93 with one another is output from the OR circuit 94.

Thus, since the circuit 55 outputs the signal 65 which has the pulse width corresponding to the amount of phase variation, the suitable phase compensation can be performed. That is, as shown in FIGS. 4 and 5, the selector 56 switches, for example, from the clock 63 to the clock 64 in response to the rise of the signal 65 and switches from the clock 64 to the clock 63 in response to the fall of the signal 65.

Incidentally, in the case of the 180 degrees-or 360 degrees-phase step mode for example, the pulse width of the signal 65 corresponds to 1.5 cycles or 2.0 cycles of the pulse 26, respectively. Therefore, in the case of the 560 degrees- or 720 degrees-phase step mode, the pulse width of the signal 65 corresponds to 2.5 cycles or 3.0 cycles of the pulse 26, respectively.

Next, the metastable preventing circuit 74 will hereinbelow be described. Now, it is assumed that the phase compensation controlling circuit 40 is constituted by only the phase difference compensating circuit 81. In this case, when with the input clock 49 of the shift register 50, even if its clock change point (i.e., the rise or fall point) is changed due to the phase variation, it does not coincide with the rise timing of the actuating clock 80 of the register 50, the control for the phase compensation is performed without hindrance. However, when the clock change point coincides with the rise timing of the actuating clock 80 or comes close sufficiently thereto (i.e., when the setup/hold time of the flip-flop can not be kept), the output clock of the shift register 50 becomes unstable due to the metastable state.

Therefore, in order to prevent the production of the unstable system clock due to the metastable, the present invention includes the metastable preventing circuit 74. The metastable preventing circuit 74 uses the clock having a high frequency, which is output from the dividing circuit 24 in the PLL 31, as the actuating clock 75, and always samples the external clock 26 a little at a time using that clock. When the phase variation occurs in the external clock 26 and thus the condition that the change point of the external clock after the phase variation coincides with the rise timing of the actuating clock 80 has been detected, the switching signal 76 is supplied to the metastable preventing selector 77 to switch its output pulse. As a result, the actuating clock 80 of the phase difference compensating circuit 81 including the shift register 50 becomes a clock the phase of which is shifted from the phase before the phase variation, and thus the sampling at the change point of the clock 49 can be prevented. Thus, the sampling timing in which the metastable occurs is avoided, whereby it is possible to perform surely the control for the phase compensation.

Figure 10:
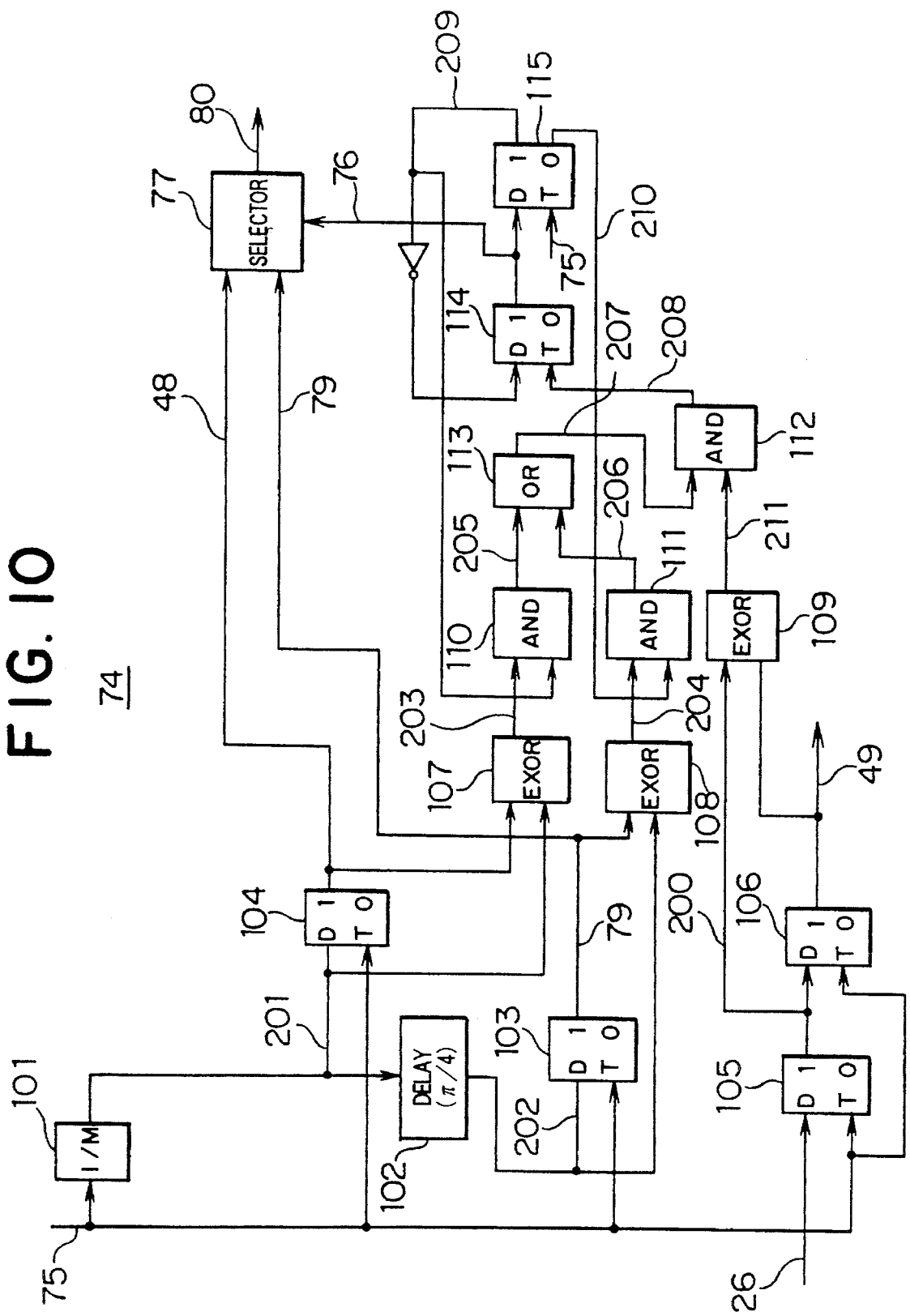
FIG. 10 is a block diagram showing an example of a configuration of a metastable preventing circuit in FIG. 3.
Figure 11:
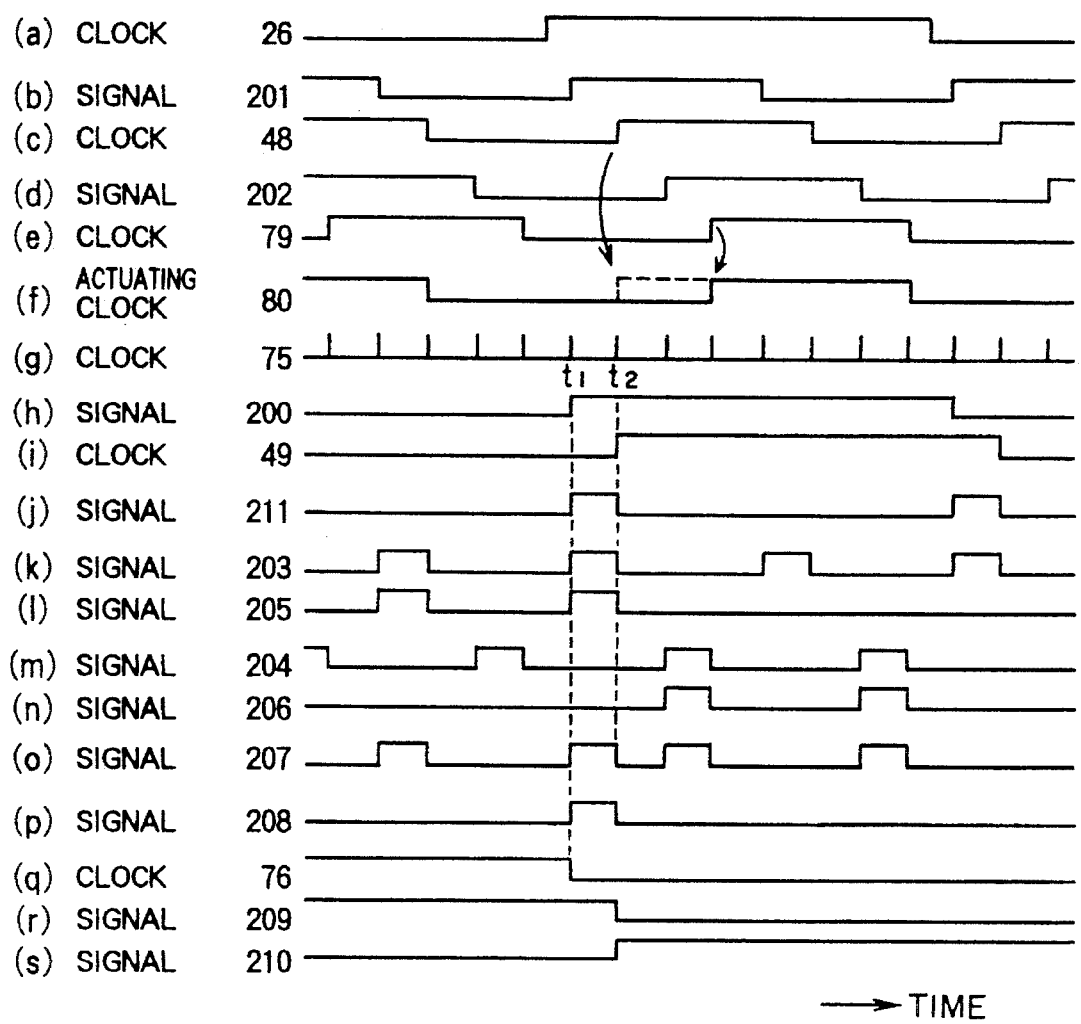
FIG. 11 is a timing chart showing signal waveforms of units useful in explaining the operation of the metastable preventing circuit of FIG. 10.

Next, the description will hereinbelow be given with respect to the configuration and operation of the metastable preventing circuit 74 with reference to a block diagram of FIG. 10 and a timing chart showing the waveforms of the units of FIG. 11. The metastable preventing circuit 74 includes a dividing circuit 101 (dividing ratio M=4n (n: positive integral number), a delay circuit 102 having a delay time of π/4, flip-flops, e.g., D-type flip-flops 103 to 106, 114 and 115, exclusive OR circuits 107 to 109, AND circuits 110 to 112, and an OR circuit 113. The waveforms of signals 201 to 211 of the units in FIG. 10 are shown in FIG. 11.

In the metastable preventing circuit 74, since the actuating clock 80 is produced on the basis of the sampling clock 75 from the dividing circuit 24, the clock 75 is divided by the dividing circuit 101. Further, the metastable preventing circuit 74 operates on the basis of the sampling clock 75. In the circuit 74 having such a configuration, as shown in FIG. 11, it is assumed that when in a state in which for example, the clock 48 is being selected as the actuating clock 80, the phase variation occurs in the clock 49, at the time t2, the change point of the clock 49 ((i) in FIG. 11) input to the shift register 50 coincides with the rise point (denoted by a dotted line in (f) in FIG. 11) of the actuating clock 80 (i.e., the clock 48). Then, at the time t1, before the time t2, when a signal 211 ((j) in FIG. 11) for detecting the change point of the clock 49 synchronizes with the clock 75, the signal 211 becomes "high", and a timing pulse detecting signal 207 representing the expected change point of the actuating clock 80 becomes also "high". Therefore, the signals 211 and 207 are AND-tied with each other in the AND circuit 112 to produce a selector switching signal 208 (((p) in FIG. 11) for preventing the metastable, whereby the level of the switching signal 76 (((q) in FIG. 11) is changed (e.g., the level of the switching signal 76 is changed into "a low level"). As a result, the selector 77 switches the clock 80 from the clock 48 to the clock 79 the phase of which is delayed from the clock 48 by π/4. Therefore, it is possible to prevent the sampling at the change point of the clock 49.

The description will hereinbelow be given with respect to the operation of the system clock phase compensating circuit of the present embodiment with reference to the timing charts shown in FIGS. 4 and 5. As the presupposition for the following description, it is assumed that the PLL is in the synchronous state. Therefore, the PLL input selector 43 of FIG. 3 is selected so as to output the output clock 46 of the phase compensating circuit 40 as the PLL input clock 44. That is, the PLL input clock 44 and the output clock 46 of the phase compensating circuit 40 are identical with each other.

First, the state before the phase variation has occurred will be described. In this case, since the external clock 26 synchronizes with the PLL output clock 25 of FIG. 3, the actuating clock 80 the cycle of which is one half of the cycle of the PLL output clock 25 is also synchronous with the external clock 26. In addition, PLL 31 of FIG. 3 operates to make its frequency to match with the frequency of the PLL input clock 44 as well as to make its phase to match with the phase thereof. Therefore, if the small error due to the offset phase error (stationary phase error) peculiar to the PLL is removed, it may be considered that the PLL input clock 44 and the PLL output clock 25 are identical with each other. In the timing charts of FIGS. 4 and 5, there is shown the timing relation in which the input clock 49 is sampled with its substantial center in the rise timing of the actuating clock 80. Therefore, in the PLL synchronization state before the phase variation has occurred in the input clock, the metastable is not generated which may be caused by sampling the change point of the input clock 49 in the asynchronous state. Thus, the phase of the output clock 59 in the first stage of the shift register 50 is delayed from the external clock 26 by about π/2 (about 90 degrees). Thereafter, since in the shift register 50, the sampling is performed on the basis of the actuating clock 80, whenever one stage of the shift register 50 is added, the corresponding output phase is delayed by π (180 degrees).

Next, the description will hereinbelow be given with respect to the specific case where the phase variation occurs in the input clock 49 to provide the 180 degrees-phase step mode with reference to FIG. 4. In this case, when as shown in (a) of FIG. 4, at the time t1, the phase variation less than 180 degrees occurs in the input clock 49, the first stage-clock 59 and the second stage-clock 60 of the shift register 50 are compared with each other by the external clock phase variation detecting circuit 51, and as a result, the condition for the 180 degrees-phase step (phase inversion) mode is produced in the phase variation detecting signal 61. In the phase matching controlling circuit 52 of FIG. 7, one trigger pulse 70 to the binary counter is produced and the binary counter is counted up by one, whereby the phase matching selector 53 is switched by one time. As a result, the output 6 of the phase matching selector 53 is switched from the clock 57 to the clock 58 at the time t2 and its phase is inverted, whereby the phase matching for the 180 degrees-phase step mode can be performed.

On the other hand, the condition for the 180 degrees-phase step mode (i.e., the low level state corresponding to π/2 of the input clock 49) represented by the phase variation detecting signal 61 is supplied to the phase compensating selector switching controlling circuit 55. Then, the phase compensating selector switching controlling circuit 55 outputs the phase compensating selector switching signal 65 corresponding to the amount of phase variation represented by the signal 61 and then performs the switching so that at the time t2, the phase compensating selector 56 selects the output clock 64 of the phase compensation controlling shift register 54. As a result, the clock variation after occurrence of the phase step is prevented from being transmitted to the output clock 46 of the phase compensating circuit.

Next, when the output clock 63 of the phase matching selector has been stabilized, at the time t3, the selector 56 is switched so as to select the output clock 63 of the phase matching selector, whereby the operation can be performed in which in the case where when the phase has been changed due to the phase variation of the external clock, after the clock before the phase change is used once to stabilize the clock, the clock is returned to the original state. The timing when the selector 56 is switched so as to select the output clock 63 of the phase matching selector 53 is decided by taking the time length of the possible phase variation into consideration during the design.

Further, the clock passing through the phase compensation controlling shift register 54 is a clock in which the phase matching control has been performed by both the phase matching selector 53 and the phase matching controlling circuit 52 provided in the preceding stages. Therefore, it is possible to perform the control in which even if the phase variation occurs in the external clock, the phase variation does not occur in the output clock 46 of the phase compensating circuit.

On the basis of the above-mentioned operations, in the 180 degrees-phase step mode, it is possible to perform the control for the phase compensation in which the phase variation does not occur in the input clock of PLL 31.

Next, the description will hereinbelow be given with respect to the operation of the phase compensating circuit in the 360 degrees-phase step mode with reference to the timing chart shown in FIG. 5. FIG. 5 is the timing chart showing the operation of the control for the phase compensation when at the time t1, one pulse lack occurs in the external clock. In the timing chart shown in FIG. 4, one trigger pulse 70 to the binary counter is produced in the phase matching controlling circuit 52 of FIG. 7, and the phase matching selector 53 is switched by one time, thereby to perform the phase matching for the 180 degrees-phase step (phase inversion) mode, whereas in the timing chart shown in FIG. 5, two trigger pulses 70 are produced in the binary counter, whereby at the time t2, the output clock of the phase matching selector 53 is switched from the clock 58 to the clock 57, and then at the time t3, the processing is returned to the original state (i.e., the output clock of the phase matching selector 53 is switched from the clock 57 to the clock 58). That is, in the 360 degrees-phase step mode, the control for the phase matching is not performed, and the clock which includes no phase variation is output to the output clock of the phase compensating circuit by the control for the phase compensation in the phase compensation controlling shift register 54 and the phase compensating selector 56 which are provided in the subsequent stages.

Incidentally, in the case of the 540 degrees-phase step mode, three trigger pulses 70 are produced and the selector 53 switches its output clock from the clock 57 to the clock 58. In the case of the 720 degrees-phase step mode, four trigger pulses 70 are produced, and the selector 53 switches its output clock from the current clock to the original clock in the same way as that in the 360 degrees-phase step mode.

Figure 12:
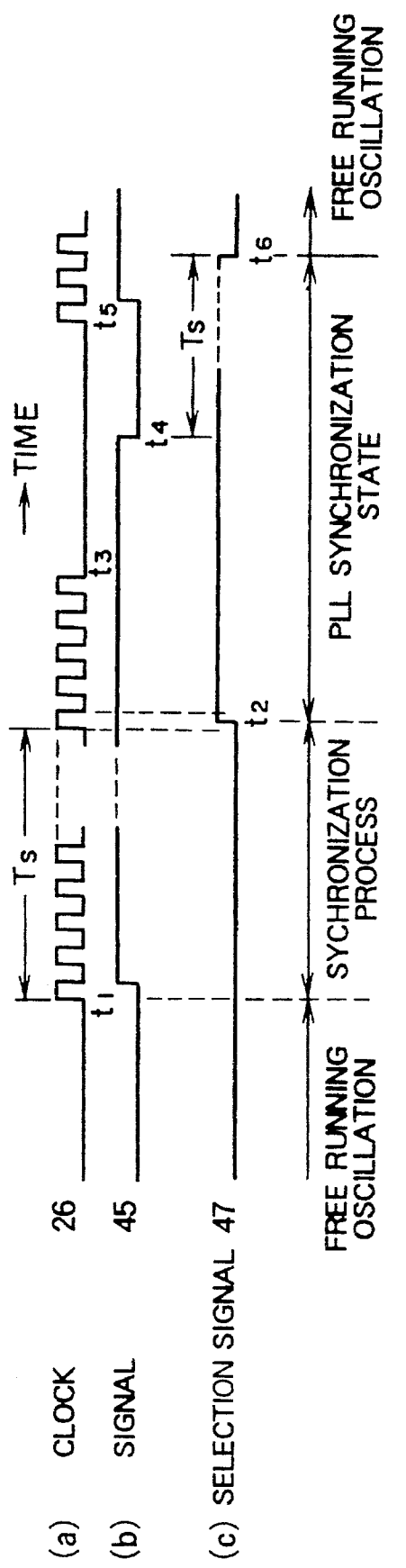
FIG. 12 is a timing chart showing signal waveforms of units useful in explaining the operations of a circuit for detecting abnormality of an external clock, and a delay circuit in FIG. 3.

The clock 46 is supplied together with the external clock 26 to the selector 43 which outputs selectively one of the clocks 46 and 26 as the PLL input clock 44 to the PLL 31 in response to the selection signal 47 from the delay circuit 42. The description will hereinbelow be given with respect to the configurations and the operations of the external clock abnormality detecting circuit 41 and the delay circuit 42 with reference to a timing chart showing the waveforms of the units of those circuits shown in FIG. 12.

The external clock abnormality detecting circuit 41 includes, for example, a monostable multivibrator and a circuit for detecting a frequency. The circuit 41 operates to receive the external clock 26 and to detect the noninput state, the interruption, the frequency abnormality, and the like of the external clock to output the abnormality detecting signal 45. That is, for example, in the state before the time t1 of (a) of FIG. 12, in the state in which the external clock 26 is not output, i.e., in the free running oscillation state of the PLL, the selector 43 selects the external clock 26 to output it. When at the time t1, the clock 26 begins to be given, the monostable multivibrator in the abnormality detecting circuit 41 operates so that the output signal 45 ((b) in FIG. 12) is switched from "a low level" to "a high level" for example. Then, in response to the output signal 45, the delay circuit 42 makes the selection signal 47 ((c) in FIG. 12) "a high level" from "a low level" for example at the time t2 after the lapse of a predetermined period of time Ts (i.e., the time required for PLL to synchronize with the external clock 26). Therefore, in response to the selection signal 47, the selector 43 switches its output clock from the clock 26 to the clock 46. Incidentally, it is required that during this switching operation, the metastable does not occur, i.e., the rise timing of the signal 47 does not coincide with the change points of the clocks 26 and 46. Therefore, the delay circuit 42 may be configured in the same manner as that of the above-mentioned metastable preventing circuit 74. Accordingly, in the synchronization process of PLL for a period ranging from the time t1 to t2, the selector 43 selects the external clock 46 to output it, and selects, after the time t2, the clock 46 to be output it thereby to make PLL in the synchronous state.

On the other hand, when the external clock 26 is interrupted at the time t3, the frequency detecting circuit in the circuit 41 detects this interruption and then makes the signal 45 "low" if the number of pulses of the clock 26 does not exceed the predetermined number of pulses, e.g., the continuous three pulses (at the time t4). Then, thereafter, at the time t6 after the lapse of the predetermined period of time Ts, the delay circuit 42 makes the selection signal 47 "low". Therefore, since in response to the selection signal 47, the selector 43 switches its output clock from the clock 46 to the external clock 26 at the time t6, PLL becomes in the free running oscillation state. If after the interruption of the external clock, the external clock recovers at the time t5, after the lapse of the predetermined period of time Ts, the selector 43 switches its output clock from the external clock 26 to the clock 46. Therefore, the PLL becomes in the synchronization state after the synchronization process.

Incidentally, in the case where the frequency of the external clock becomes abnormal, likewise, after the lapse of the predetermined period of time ts, the selector 43 switches its output from the clock 46 to the external clock 26 to make PLL in the free running oscillation state. Further, thereafter, the operation of the system when the external clock has been returned to the normal state is the same as that in the case of the interruption of the external clock.

Figure 13:
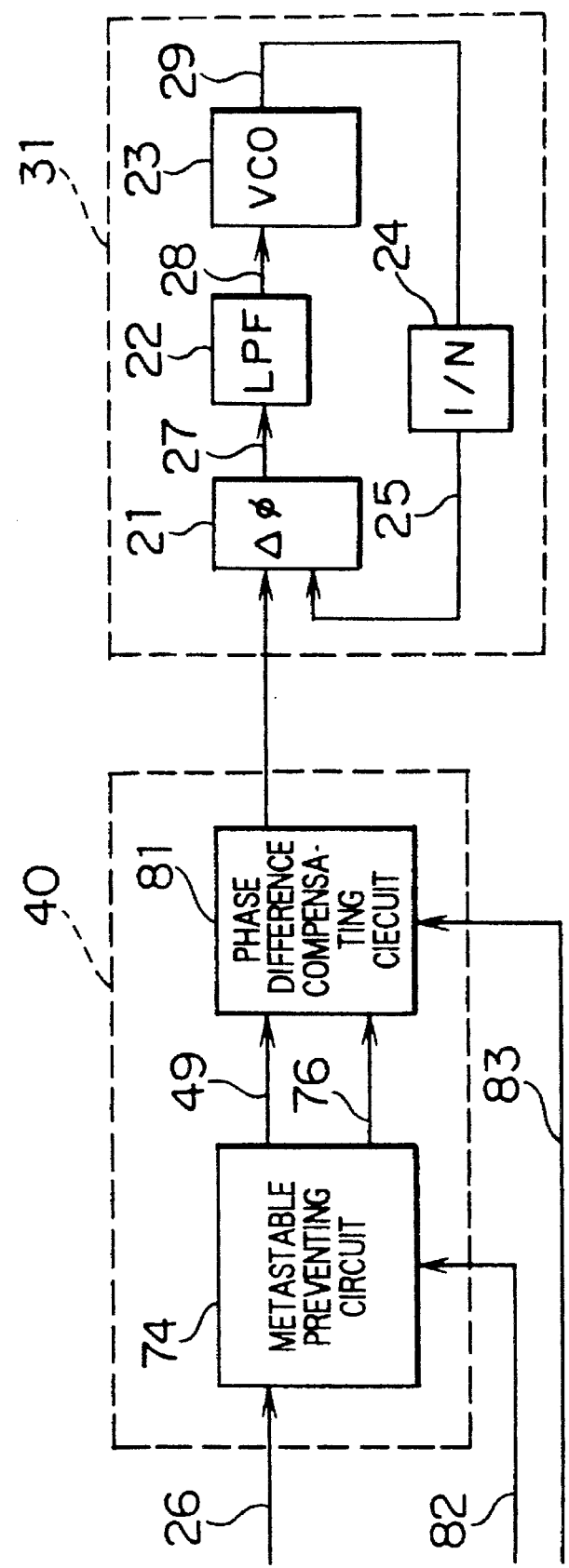
FIG. 13 is a block diagram showing a configuration of a system clock generating circuit having a circuit for compensating a phase of a system clock according to a second embodiment of the present invention.

FIG. 13 is a block diagram showing a configuration of a second embodiment of the present invention. The present embodiment shown in FIG. 13 is designed in such a way that each of actuating clocks 82 and 83 of the phase compensating circuit 40 always synchronizes with the external clock 26, but in addition to the external clock 26, those clocks in which any phase variation does not occur are used to perform the control for the phase compensation of the system clock. The operation of the phase compensating circuit 40 is the same as that in the above-mentioned description. In the configuration of FIG. 3, the output clocks 48 and 75 of the dividing circuit in PLL 31 are used as the actuating clock for the phase compensating circuit 40. Therefore, in the synchronization process from the free running oscillation state of the PLL up to the synchronization of PLL with the external clock by the recovery of the external clock, in order to prevent the unstable operation of the PLL, in terms of the configuration of the circuit, the external clock abnormality detecting circuit 41, the delay circuit 42 and the selector 43 are necessary. However, in the configuration of FIG. 13, since the actuating clocks 82 and 83 of the phase compensating circuit 40 always synchronize with the external clock 26, the above-mentioned accessory circuits 41, 42 and 43 are unnecessary.

As described above, according to the present invention, the fault due to the temporal frequency variation of PLL following the phase variation of the external clock can be effectively avoided without the provision of the elastic buffer. Therefore, there is provided the effects that the data delay can be improved which is caused by passage of the data through the elastic buffer, and the response time of the system in LAN can be shortened.

Incidentally, the preferred embodiments of the present invention are designed in such a way that the system clock is produced by PLL. However, it is to be understood that the present invention is not limited thereto or thereby, and the function of receiving the external clock to divide or multiply the external clock may be available.

As set forth hereinabove, according to the present invention, it is possible to provide the information processing system which can supply the system clock, in which the phase variation does not occur, by performing the phase compensation for the system clock when the phase of the external clock is varied.

What is claimed is:

1. An apparatus for compensating a phase of a system clock for use in a system clock circuit for receiving an external clock to produce a system clock for an information processing system, comprising:

a phase variation quantity detecting means for detecting a quantity of phase variation of the external clock supplied from a reference clock oscillator provided outside the system; and a compensation means for compensating, in accordance with the quantity of phase variation detected by said phase variation quantity detecting means, the phase variation of the external clock supplied from said reference clock oscillator to supply a compensated external clock to said system clock circuit, wherein said compensation means holds an external clock signal of the external clock supplied from said reference clock oscillator which is generated before occurrence of phase variation of the external clock, and wherein when phase variation occurs in the external clock signal, said compensation means, in response to the detection of the quantity of phase variation of the external clock signal by said phase variation quantity detecting means, supplies the external clock signal having been held to said system clock circuit as the compensated external clock instead of the external clock supplied from said reference clock oscillator.

said compensation means including:

a dual clock generating means for generating, on a basis of the external clock supplied from said reference clock oscillator, two clocks which are asynchronous with the external clock and are 180 degrees out of phase with each other;

a first selection means for selecting one of the two clocks supplied from said dual clock generating means in accordance with the quantity of phase variation detected by said phase variation quantity detecting means, and outputting a selected clock as a first selection clock;

a delay means for delaying the first selection clock output by said first selection means by a predetermined period of time to output a delayed clock; and a second selection means for selecting, in accordance with the quantity of phase variation detected by said phase variation quantity detecting means, one of said first; selection clock output by said first selection means and the delayed clock output from said delay means to supply a second selection clock to said system clock circuit.

2. An apparatus for compensating a phase of a system clock for use in a system clock circuit for receiving an external clock to produce a system clock for an information processing system, comprising:

a detection means for detecting whether or not a state of the external clock supplied from a reference clock oscillator provided outside the system is abnormal to output a detection signal representing the detected state of an external clock;

a compensation means for compensating a phase of the external clock supplied from said reference clock oscillator to output a compensated external clock; and a selection means for selecting, in response to the detection signal supplied from said detection means, one of the external clock supplied from said reference clock oscillator and the compensated external clock supplied from said compensation means to supply a first selection clock to said system clock circuit;

wherein said compensation means holds an external clock signal of the external clock supplied from said reference clock oscillator which is generated before occurrence of an abnormal state of the external clock, and wherein when an abnormal state occurs in the external clock, said compensation means, in response to the detection of the abnormal state of the external clock signal by said detection means, supplies the external clock signal having been held to said selection means as the compensated external clock signal instead of the external clock supplied from said reference clock oscillator, said compensation means including:

a dual clock generating means for generating, on a basis of the external clock supplied from Said reference clock oscillator, two clocks which are asynchronous with the external clock and are 180 degrees out of phase with each other;

a first selector circuit for selecting one of the two clocks supplied from said dual clock generating means in accordance with the quantity of abnormality detected by said detection means, and outputting a selected clock as a first selector clock;

a delay means for delaying the first selector clock output by said first selector circuit by a predetermined period of time to output a delayed clock; and a second selector circuit for selecting, in accordance with the quantity of abnormality detected by said detection means, one of said first selector clock output by said first selector circuit and the delayed clock output from said delay means to supply second selector clock to said selection means.

3. An apparatus according to claim 2, further comprising:

a delay means for delaying the detection signal supplied from said detection means by a predetermined period of time to supply the delayed detection signal to said first selection means.

4. An apparatus according to claim 2, wherein said detection means includes phase variation quantity detecting means for detecting the quantity of phase variation of the external clock supplied from said reference clock oscillator representing the abnormal state of said external clock signal and outputting the detection signal representing the detected quantity of phase variation representing the abnormal state, and wherein said compensation means compensates the phase variation of the external clock supplied from said reference clock oscillator in accordance with the quantity of phase variation detected by said phase variation quantity detecting means to supply the compensated external clock to said system clock circuit.

5. An apparatus according to claim 2, further comprising:

a control means for controlling said first selection means in such a way that a timing in which said first selection means selects one of the external clock supplied from said reference clock oscillator and the compensated external clock supplied from said compensation means to supply the selected external clock to said system clock circuit corresponds to a suitable time point other than change points of these clocks.

6. An apparatus according to claim 4, further comprising:

a control means for controlling said first selector circuit and said second selector circuit in such a way that a timing in which said first selector circuit and said second selector circuit switches their inputs corresponds to a suitable time point other than change points of the inputs.

7. A system clock generator for receiving an external clock to produce a system clock for an information processing system, comprising:

a detection means for detecting whether or not a state of the external clock supplied from a reference clock oscillator provided outside the system is abnormal to output a detection signal representing a detected state of the external clock;

a compensation means for compensating a phase of the external clock supplied from said reference clock oscillator to output a compensated external clock;

a selection means for selecting, in response to the detection signal supplied from said detection means, one of the external clock supplied from said reference clock oscillator and the compensated external clock supplied from said compensation means to output the selected external clock; and a system clock circuit for producing, in accordance with the selected external clock supplied from said selection means, the system clock for said information processing system;

wherein said compensating step is accomplished by the sub-steps of holding an external clock signal of the external clock supplied from said reference clock oscillator which is generated before occurrence of phase variation of the external clock, and wherein when phase variation occurs in the external clock outputting a held said external clock signal for use in said system clock circuit as the compensated external clock instead of the external clock supplied from said reference clock oscillator, said compensation means including:

a dual clock generating means for generating, on a basis of the external clock supplied from said reference clock oscillator, two clocks which are asynchronous with the external clock and are 180 degrees out of phase with each other;

a first selector circuit for selecting one of the two clocks supplied from said dual clock generating means in accordance with the quantity of abnormality detected by said detection means, and outputting a selected clock as a first selector clock;

a delay means for delaying the first selector clock output by said first selector circuit by a predetermined period of time to output a delayed clock; and a second selector circuit for selecting, in accordance with the quantity of abnormality detected by said detection means, one of said first selector clock output by said first selector circuit and the delayed clock output from said delay means to supply a second selector clock to said selection means.

8. A method of compensating a phase of an external clock for use in a system clock circuit for producing a system clock for an information processing system, comprising the step of:

compensating, at a time when a phase variation occurs in the external clock supplied from a reference clock oscillator provided outside the system, a phase of the external clock supplied from said reference clock oscillator to supply a compensated external clock to said system clock circuit;

wherein said compensating step is accomplished by the sub-steps of holding an external clock signal of the external clock supplied from said reference clock oscillator which is generated before occurrence of phase variation of the external clock, and wherein when phase variation occurs in the external clock outputting a held said external clock signal for use in said system clock circuit as the compensated external clock instead of the external clock supplied from said reference clock oscillator, and said sub-steps more specifically include the steps of:

generating, on a basis of the external clock supplied from said reference clock oscillator, two clocks which are asynchronous with the external clock and are 180 degrees out of phase with each other;

a first selecting step of selecting one of the two clocks supplied from said generating step in accordance with the quantity of phase variation, and outputting a selected clock as a first selector clock;

delaying the first selector clock to output a delayed clock; and a second selecting step of selecting, in accordance with the quantity of phase variation, one of said first selector clock and the delayed clock to supply a second selector clock to said system clock circuit.

9. A method of compensating a phase of an external clock for use in a system clock circuit for producing a system clock for an information processing system, comprising the steps of:

detecting a quantity of phase variation of the external clock supplied from a reference clock oscillator provided outside the system; and compensating, in accordance with the detected quantity of phase variation, the phase variation of the external clock supplied from said reference clock generator to supply a compensated external clock to said system clock circuit;

wherein said compensating step is accomplished by the sub-steps of holding an external clock signal of the external clock supplied from said reference clock oscillator which is generated before occurrence of phase variation of the external clock, and wherein when phase variation occurs in the external clock outputting a held said external clock signal for use in said system clock circuit as the compensated external clock instead of the external clock supplied from said reference clock oscillator, and said sub-steps more specifically include the steps of:

generating on a basis of the external clock supplied from said reference clock oscillator, two clocks which are asynchronous with the external clock and are 180 degrees out of phase with each other;

a first selecting step of selecting one of the two clocks supplied from said generating step in accordance with the quantity of phase variation, and outputting a selected clock as a first selector clock;

delaying the first selector clock to output a delayed clock; and a second selecting step of selecting, in accordance with the quantity of phase variation, one of said first selector clock and the delayed clock to supply a second selector clock to said system clock circuit.

10. A method of compensating a phase of an external clock for use in a system clock circuit for producing a system clock for an information processing system, comprising the steps of:

detecting whether or not a state of the external clock supplied from a reference clock oscillator provided outside the system is abnormal;

compensating a phase of the external clock supplied from said reference clock oscillator; and selecting, in accordance with the detected state of the external clock, one of the external clock supplied from said reference clock oscillator and the compensated external clock to supply a selected external clock to said system clock circuit;

wherein said compensating step is accomplished by the sub-steps of holding an external clock signal of the external clock supplied from said reference clock oscillator which is generated before occurrence of phase variation of the external clock, and wherein when phase variation occurs in the external clock outputting a held said external clock signal for use in said system clock circuit as the compensated external clock instead of the external clock supplied from said reference clock oscillator, and said sub-steps more specifically include the steps of:

generating, on a basis of the external clock supplied from said reference clock oscillator, two clocks which are asynchronous with the external clock and are 180 degrees out of phase with each other;

a first selecting step of selecting one of the two clocks supplied from said generating step in accordance with the quantity of phase variation, and outputting a selected clock as a first selector clock;

delaying the first selector clock to output a delayed clock; and a second selecting step of selecting, in accordance with the quantity of phase variation, one of said first selector clock and the delayed clock to supply a second selector clock to said system clock circuit.

11. A method according to claim 10, further comprising the step of:

supplying, at the time of detecting the abnormality of the external clock, after the lapse of a predetermined period of time, the external clock supplied from said reference clock oscillator instead of the compensated external clock to said system clock circuit.

12. A method according to claim 10, further comprising the step of:

supplying, at the time when the external clock begins to be supplied from said reference clock oscillator or the external clock is recovered from its interruption, after the lapse of a predetermined period of time, the compensated external clock instead of the external clock supplied from said reference clock oscillator to said system clock circuit.

13. A method according to claim 10, further comprising the step of:

detecting the quantity of phase variation of the external clock supplied from said reference clock oscillator, wherein in said compensating step, in accordance with the detected quantity of phase variation, the phase variation of the external clock supplied from said reference clock oscillator is compensated to supply the compensated external clock to said system clock circuit.

14. A method according to claim 10, wherein in said selecting step, the timing in which one of the external clock supplied from said reference clock oscillator and the compensated external clock supplied from said compensation means is selected to supply the selected external clock to said system clock circuit is made to correspond to a suitable time point other than change points of these clocks.

15. A method according to claim 13, wherein in said step of detecting the quantity of phase variation, the quantity of phase variation is detected using a clock synchronous with the external clock.

16. A method according to claim 13, wherein in said step of detecting the quantity of phase variation, the quantity of phase variation is detected using the system clock supplied from said system clock circuit.

17. An apparatus according to claim 1, wherein said compensation means supplies the external clock signal having been held to said system clock circuit as the compensated external clock instead of the external clock supplied from said reference clock oscillator, during a period corresponding to the detected quantity of the phase variation.

18. An apparatus according to claim 17, wherein said phase variation quantity detecting means detects whether a quantity of the phase variation of the external clock is $(2m+1)\times180°$ wherein m is 0 a fixed integer of 1 or more) or $n\times360°$ (where n is a fixed integer of 1 or more), said compensation means more specifically includes a first delay means for delaying the external clock supplied from said reference clock oscillator by $(2p+1)\times180°$ (where p is a fixed integer of 1 or more) and outputting the delayed external clock, and second delay means for delaying the external clock supplied from said reference clock oscillator by $q\times360°$ (where q is a fixed integer of 2 or more) and outputting the delayed external clock, and a selection unit, when the detected quantifies of the phase variation are $(2m+1)\times180°$ and $n\times360°$, respectively, supplies said delayed external clock from said first and second delay means to said system clock circuit as the compensated external clock instead of the external clock supplied from said reference clock oscillator, during a period corresponding to the detected quantity of the phase variation.

19. An apparatus according to claim 17, wherein at least one of said first delay means and said second delay means includes a shift resister for delaying the external clock from said reference clock oscillator for a predetermined period.

20. An apparatus according to claim 1, wherein said second selection means, when phase variation occurs in the external clock, in response to the detection of the quantity of phase variation of the external clock by said phase variation quantity detecting means, supplying the delayed clock from said delay means to said system clock circuit as the compensated external clock instead of said first selection clock from said selection means, during a period corresponding to the detected quantity of the phase variation.

21. An apparatus according to claim 20, wherein said phase variation quantity detecting means detects whether a quantity of the phase variation of the external clock is $(2m+1)\times180°$ (where m is 0 or a fixed integer of 1 or more) or $n\times360°$ (where n is a fixed integer of 1 or more), and said delay means delays said first selection clock output by said selection means by $p\times180°$ (where p is a fixed integer of 3 or more) and outputting the delayed external clock.

22. An apparatus according to claim 3, wherein said compensation means supplies the external clock signal having been held to said selection means as the compensated external clock instead of the external clock signal supplied from said reference clock oscillator, during a period corresponding to a period of the detected abnormal stale.

23. An apparatus according to claim 22, wherein said detection means detects whether a quantity of the phase variation of the external clock representing said abnormal state is $(2m+1)\times 180°$ (where m is 0 or a fixed integer of 1 or more), or $n\times 360°$ (where n is a fixed integer of 1 or more), said compensation means more specifically includes a first delay means for delaying the external clock supplied from said reference clock oscillator by $(2p+1)\times 180°$ (where p is a fixed integer of 1 or more) and outputting the delayed external clock, and second delay means for delaying the external clock supplied from said reference clock oscillator by $q\times 360°$ (where q is a fixed integer of 2 or more) and outputting the delayed external clock, and said selection unit, when the detected quantities of the phase variation are $(2m+1)\times 180°$ and $n\times 360°$, respectively, supplies said delayed external clock from said first and second delay means to said selection means as the compensated external clock instead of the external clock supplied from said reference clock oscillator, during a period corresponding to the detected quantity of the phase variation.

24. An apparatus according to claim 3, wherein said detection means detects an quantity of phase variation of the external clock representing said abnormal state, said compensation means includes delay means for delaying the external clock supplied from said reference clock oscillator by a predetermined period and outputting a delayed clock, and said first selection means, when phase variation occurs in the external clock as the abnormal state of the external clock, in response to the detection of the quantity of phase variation of the external clock by said detection means, supplying the delayed clock from said delay means to said system clock circuit as the compensated external clock instead of the external clock supplied from said reference clock oscillator, during a period corresponding to the detected quantity of the phase variation.

25. An apparatus according to claim 24, wherein said detection means detects whether a quantity of the phase variation of the external clock is $(2m+1)\times 180°$ (where m is 0 or a fixed integer of 1 or more) or $n\times 360°$ (where n is a fixed integer of 1 or more), and said delay means delays the external clock from said reference clock oscillator by $p\times 180°$ (where p is a fixed integer of 3 or more) and outputting the delayed external clock.

26. An apparatus according to claim 5, wherein said second selector circuit, when phase variation occurs in the external clock, in response to the detection of the quantity of phase variation of the external clock by said phase variation quantity detecting means, supplying the delayed clock from said delay means to said selection means as the compensated external clock instead of said second selector clock from said second selector circuit, during a period corresponding to the detected quantity of the phase variation.

27. An apparatus according to claim 26, wherein said phase variation quantity detecting means detects whether a quantity of the phase variation of the external clock is $(2m+1)\times 180°$ (where m is 0 or a fixed integer of 1 or more) or $n\times 360°$ (where n is a fixed integer of 1 or more), and said delay means delays said second selection clock from said second selection means by $p\times 180°$ (where p is a fixed integer of 3 or more) and outputting the delayed external clock.

28. An apparatus according to claim 7, wherein said compensation means supplies the external clock signal having been held to said selection means as the compensated external clock instead of the external clock signal supplied from said reference clock oscillator, during a period corresponding to a period of the detected abnormal state.

29. An apparatus according to claim 28, wherein said detection means detects whether a quantity of the phase variation of the external clock representing said abnormal state is $(2m+1)\times 180°$ (where m is 0 or a fixed integer of 1 or more), or $n\times 360°$ (where n is a fixed integer of 1 or more), said compensation means more specifically includes a first delay means for delaying the external clock supplied from said reference clock oscillator by $(2p+1)\times 180°$ (where p is a fixed integer of 1 or more) and outputting the delayed external clock, and second delay means for delaying the external clock supplied from said reference clock oscillator by $q\times 360°$ (where q is a fixed integer of 2 or more) and outputting the delayed external clock, and a selection unit which, when the detected quantifies of the phase variation are $(2m+1)\times 180°$ and $n\times 360°$, respectively, supplies said delayed external clock from said first and second delay means to said selection means as the compensated external clock instead of the external clock supplied from said reference clock oscillator, during a period corresponding to the detected quantity of the phase variation.

30. An apparatus according to claim 7, wherein said detection means detects an quantity of phase variation of the external clock representing said abnormal state, said compensation means includes delay means for delaying the external clock supplied from said reference clock oscillator by a predetermined period and outputting a delayed clock, and said selection means, when phase variation occurs in the external clock as the abnormal state of the external clock, in response to the detection of the quantity of phase variation of the external clock by said detection means, supplying the delayed clock from said delay means to said system clock circuit as the compensated external clock instead of the external clock supplied from said reference clock oscillator, during a period corresponding to the detected quantity of the phase variation.

31. An apparatus according to claim 30, wherein said detection means detects whether a quantity of the phase variation of the external clock is $(2m+1)\times 180°$ (where m is 0 or a fixed integer of 1 or more) or $n\times 360°$ (where n is a fixed integer of 1 or more), and said delay means delays the external clock from said reference clock oscillator by $p\times 180°$ (where p is a fixed integer of 3 or more) and outputting the delayed external clock.

* * * * *